United States Patent
Deng et al.

(10) Patent No.: US 7,303,985 B2
(45) Date of Patent: Dec. 4, 2007

(54) ZEOLITE-CARBON DOPED OXIDE COMPOSITE LOW K DIELECTRIC

(75) Inventors: Hai Deng, Mountain View, CA (US); Huey-Chiang Liou, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 10/716,250

(22) Filed: Nov. 17, 2003

(65) Prior Publication Data
US 2005/0107242 A1   May 19, 2005

(51) Int. Cl.
*H01L 21/31*   (2006.01)
(52) U.S. Cl. ............ 438/623; 438/633; 438/638; 438/E21.273; 438/E21.259
(58) Field of Classification Search ........ 257/758, 257/767, E21.581; 438/623, 633
See application file for complete search history.

(56) References Cited

U.S. PATENT DOCUMENTS

| | | | |
|---|---|---|---|
| 6,573,131 B2 * | 6/2003 | Yan et al. ............... 438/207 |
| 2002/0132468 A1 | 9/2002 | Wong | |
| 2002/0140103 A1 * | 10/2002 | Kloster et al. ........... 257/767 |
| 2004/0047798 A1 * | 3/2004 | Oh et al. ................. 423/414 |
| 2005/0236714 A1 * | 10/2005 | Leu et al. ................ 257/758 |

OTHER PUBLICATIONS

Wang, Zhengbao et al., "Pure-Silica Zeolite Low-k Dielectric Thin Films," Advanced Materials, vol. 13, No. 10, May 17, 2001, pp. 746-749.
Morris, et al. Method of Fabrication of Low Dielectric Constant Porous Metal Silicate Films, U.S. Appl. No. 10/323,988, Filed Dec. 17, 2002, 23 pages.
Zhengbao Wang, et al., Pure Silica Zeolite Films as Low-k Dielectrics by Spin-On of Nanoparticle Suspensions, Advanced Materials 2001, No. 19, Oct. 2, pp. 1463-1466.
Zhengbao Wang, et al., Silica Zeolite Low-k Dielectric Films, Department of Chemical and Environmental Engineering, University of California, Riverside, 15 pages, date unknown.

* cited by examiner

*Primary Examiner*—Steven Loke
*Assistant Examiner*—Dao H. Nguyen
(74) *Attorney, Agent, or Firm*—David P. McAbee

(57) ABSTRACT

A method for forming a zeolite-carbon doped oxide (CDO) composite dielectric material is herein described. Zeolite particles may be dispersed in a solvent. The zeolite solvent solution may then be deposited on an underlying layer, such as a wafer of other dielectric layer. At least some solvent may then be removed to form a zeolite film. A CDO may then be deposited in the zeolite film to form a zeolite-CDO composite film/dielectric. The zeolite-CDO composite film/dielectric may then be calcinated to form a solid phase zeolite-CDO composite dilectric.

18 Claims, 4 Drawing Sheets

ZEOLITE-CARBON DOPED OXIDE COMPOSITE LOW K DIELECTRIC

FIELD

This invention relates to the field of fabricating semiconductor devices and, in particular, to composite low k dielectrics.

BACKGROUND

Modern integrated circuits generally contain several layers of interconnect structures fabricated above a substrate. The substrate may have active devices and/or conductors that are connected by the interconnect structure.

Interconnect structures, typically comprising trenches and vias, are usually fabricated in, or on, an interlayer dielectric (ILD). It is generally accepted that, the dielectric material in each ILD should have a low dielectric constant (k) to obtain low capacitance between conductors. Decreasing this capacitance between conductors, by using a low dielectric constant (k), results in several advantages. For instance, it provides reduced RC delay, reduced power dissipation, and reduced cross-talk between the metal lines.

Materials commonly used to achieve low k dielectrics/films are carbon doped oxides (CDOs) or amorphous CDOs. CDOs tend to have a k value less than 3.5, but suffer from weak mechanical properties. These weak mechanical properties often result in cracking of the CDO during high stress processing and packaging steps.

Another material that may be potentially used for ILDs is zeolite or silica zeolite. Zeolite material is advantageous in that they have high porosity and a relatively uniform pore distribution. Zeolite material also is known to have good mechanical strength. Furthermore, zeolite films have dielectric constants in the range of 2.7 and smaller. Yet, zeolite is a crystalline structure, which makes forming a uniform film extremely difficult.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as examples of specific solvents, deposition methods, carbon doped oxides, etc. in order to provide a thorough understanding of the present invention. It will be apparent, however, to one skilled in the art that these specific details need not be employed to practice the present invention. In other instances, well known methods and materials, such as spin-coating, dip-coating, and zeolite nano-particle preparation have not been described in detail in order to avoid unnecessarily obscuring the present invention.

The method and interconnect structure described herein are for forming interlayer dielectrics (ILDs) from a zeolite-carbon doped oxide (CDO) composite. A composite may be any combination of two or more materials, such as a carbon doped oxide and zeolite, whether actual bonds are present or not. A composite may also be a material formed from a combination of materials which differ in composition or form and retain their identities and properties. A composite may also include a nano-composite, where the zeolite particles are nano sized.

Figure 1:
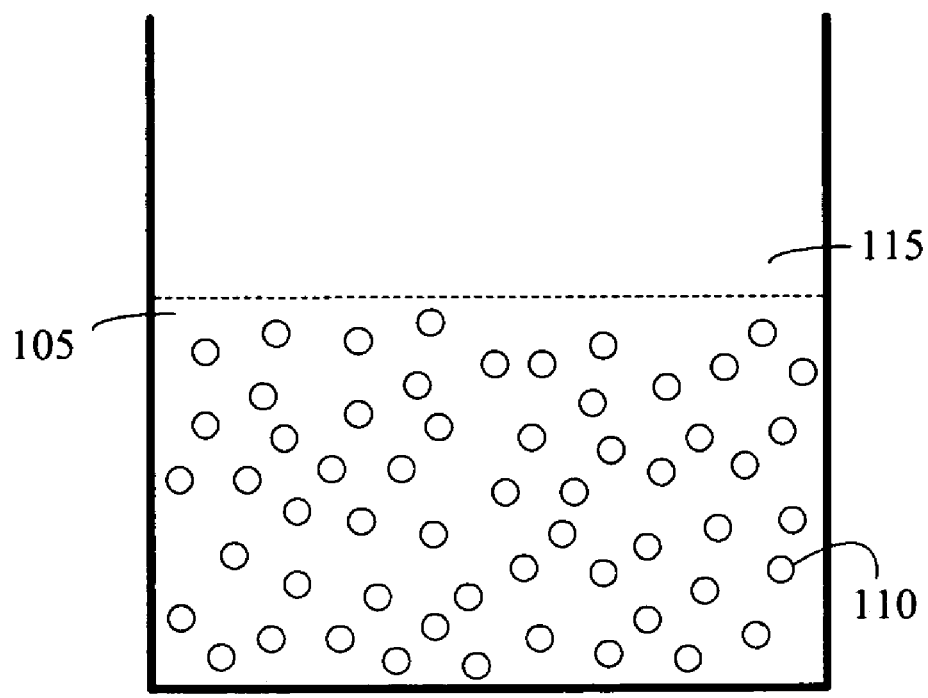
FIG. 1 illustrates a solution with zeolite particles dispersed in the solvent.

Referring to FIG. 1, a solvent-zeolite solution 115 is depicted. Solvent-zeolite solution 115 may be any suspension, mixture, solution, or colloid comprising solvent 105 and zeolite particles 110. Zeolite particles 110 are dispersed in solvent 105. Solvent 105 may be any low molecular solvent, such as water, or solvent 105 may be any organic oligomer, such as polyethylene glycol, poly styrene, poly (Methacrylates), Poly (acrylate), poly ethylene oxide, or any other organic oligormer. Zeolite particles 110 may be dispersed in solvent 105 by adding them to solvent 105. Furthermore, zeolite particles 110 may be dispersed in solvent 105 by stirring both zeolite particles 110 and solvent 105. For example, zeolite particles 110 may be dispersed/stirred into solvent 105 by putting the solution in a centrifuge and spinning solvent 105 until zeolite particles 110 are suspended in solvent-zeolite solution 115.

Zeolite particles 105 may be any size particles including nano-sized particles. Nano-sized zeolite particles may be obtained by spinning a zeolite-solvent solution at low speeds to separate out the large zeolite particles. Furthermore, the amount of zeolite particles 110 may be varied to obtain different zeolite concentration in the solvent-zeolite solution 115, as well as the properties of the final zeolite-carbon doped oxide composite, which is discussed later in reference to FIGS. 4-7.

Figure 2:
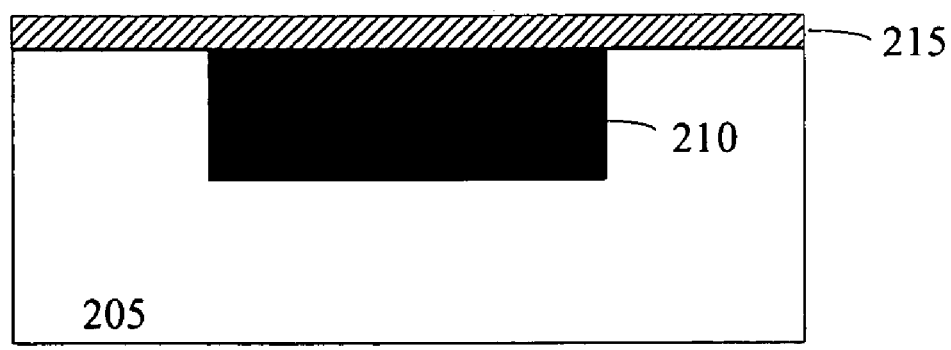
FIG. 2 is a cross-sectional elevation view of an underlying layer with a conductor and an etch stop disposed on the underlying layer.

Turning to FIG. 2, and underlying layer 205 is depicted, which often is comprised of several active devices and/or a layer with conductors exposed. Underlying layer 205 may be a semiconductor wafer including device regions, other structures such as gates, local interconnects, metal layers, or other active/passive device structures or layers.

In FIG. 2, underlying layer 205 has underlying conductor 210. Underlying conductor 210 may be copper or copper alloy, as well as some other conductive material such as gold. Underlying layer 205 may also be a carbon doped oxide-zeolite composite dielectric in accordance with this disclosure, which may contain any of the aforementioned devices. An etch stop 215 is disposed on underlying layer 205, which may be comprised of silicon nitride ($Si_3N_4$), silicon carbide (SiC), or any other etch resistant material.

Figure 3:
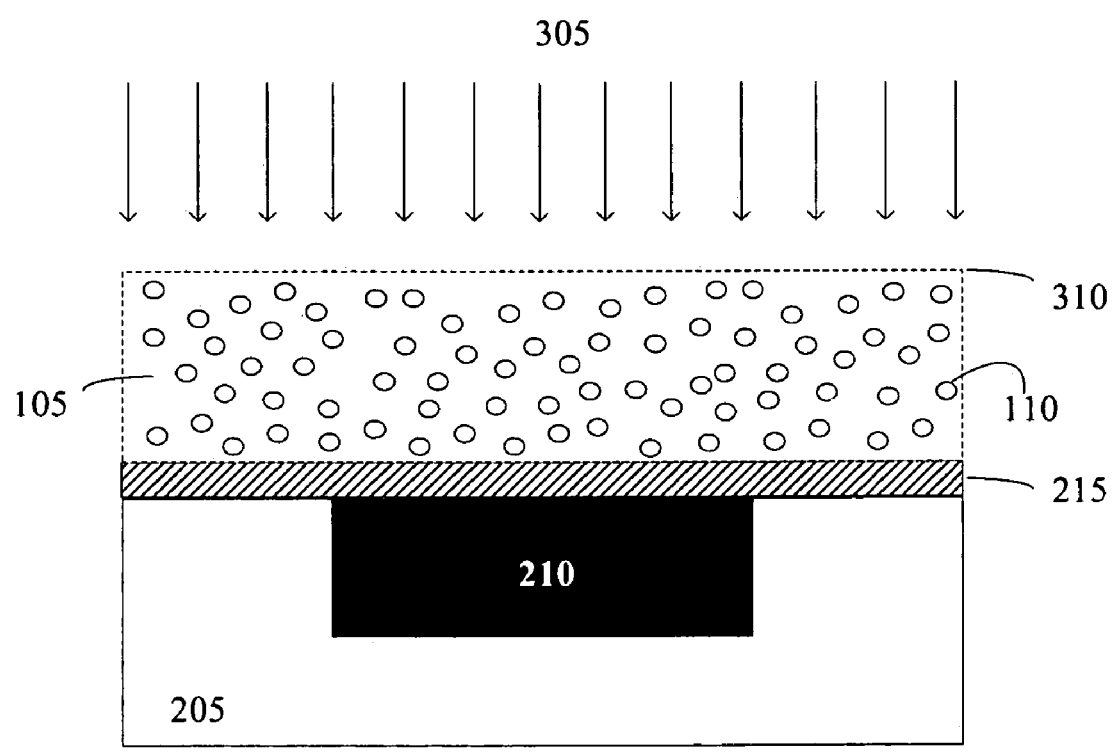
FIG. 3 is a cross-sectional elevation view of the solution from FIG. 1 after it has been deposited on the underlying layer from FIG. 2 and at least some of the solvent has been removed to form a zeolite film.

FIG. 3 illustrates a zeolite film 310 disposed on underlying layer 205 after a zeolite-solvent solution, such as zeolite-solvent solution 115 as shown in FIG. 1, has been deposited on underlying layer 205 and at least some of the solvent has been removed in step 305. Step 305 may include deposition of a zeolite-solvent solution. Deposition of a zeolite-solvent solution may include any variety of known methods for deposition of materials in semiconductor fabrication. For example, the zeolite-solvent solution may be deposited by dip-coating underlying layer 205 in the zeolite-solvent solution. As another example, the zeolite-solvent solution may be deposited by spin-coating the zeolite-solvent solution on underlying layer 205. It is readily apparent that these well-known methods, as well as other well-known methods, of depositing dielectric material may be used to deposit the solvent solution on underlying layer 205.

Furthermore, step 305 may include removing at least some of the solvent from the zeolite-solvent solution to form zeolite film 310. Removing at least some of the solvent may include drying the zeolite-solvent solution to remove at least some of the solvent. For example, drying may be done in air or by vacuum.

Figure 4:
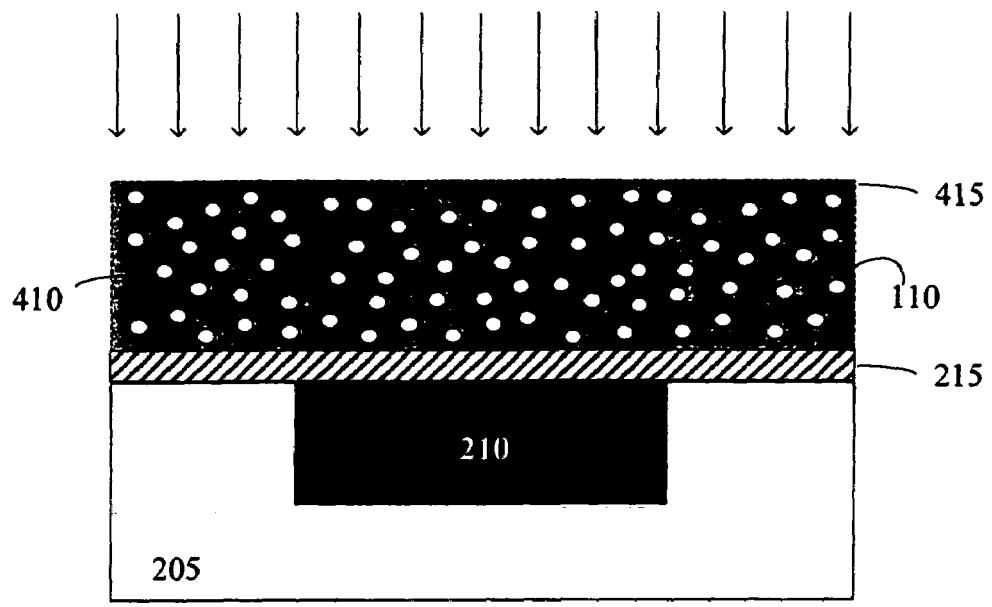
FIG. 4 is a cross-sectional elevation view of FIG. 3 after a carbon doped oxide precursor has been deposited in the poruos zeolite film to form a zeolite-CDO film.

FIG. 4 illustrates zeolite-carbon doped oxide (CDO) composite film 415 disposed on underlying layer 205, after a CDO has been deposited in a zeolite film, such as zeolite film 310 shown in FIG. 3, in step 405. As an example CDO 410 may be silicon oxide, $(SiC_xO_yH_z)$, or any other CDO. Step 405 may be any process where CDO 410 is deposited in a zeolite film. As an illustrative example of CDO deposition process 405, CDO 410 may be deposited in a zeolite film by chemical vapor deposition.

Figure 5:
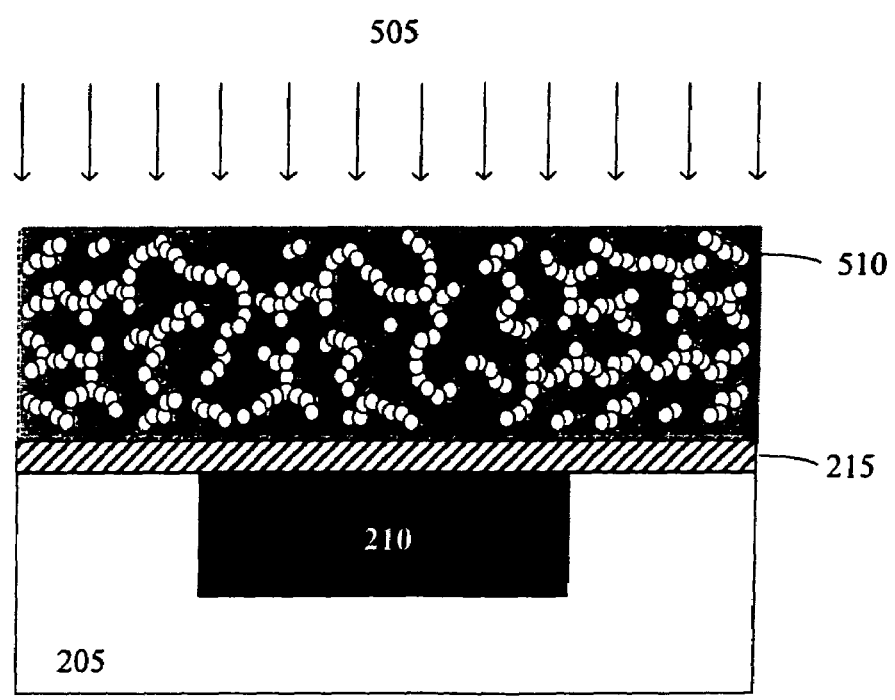
FIG. 5 is a cross-sectional elevation view of FIG. 4 after the zeolite-CDO film has been calcinated.

As shown in FIG. 5, after CDO 410 is deposited, the zeolite-CDO may be re-flowed and calcinated, such as in calcinations process 505. Calcination process 505 may form a zeolite-CDO composite dielectric/film, such as zeolite-CDO composite dilectric layer 510. Step 505 may be any process where the zeolite-CDO composite film 415, as shown in FIG. 4, is heated and cooled to form zeolite-CDO composite dielectric layer 510, shown if FIG. 5.

For example, calcination process 505 may include heating zeolite-CDO composite film 415. As a specific example, zeolite-CDO composite film 415 may be heated at an ambient temperature in the range of 300° C. to 550° C. for an amount of time. Heating may be done in oven, furnace, or any other device for heating interconnect structures. Heating may also cause the CDO components of zeolite-CDO composite film 415 to reflow and form a continuous matrix. Calcination process 505 may also include oxidizing zeolite-CDO composite film 415. Oxidizing zeolite-CDO composite film 415 may include allowing the air to oxidize zeolite-CDO composite film 415 over a period of time or exposing the structure to an induced ozone. Moreover, calcination process 505 may also include vacuuming to remove any side-product from zeolite-CDO composite film 415.

It is readily apparent that each of the methods of removing liquid from zeolite-CDO composite film 415 may individually or combinationally be used to extract at least some liquid from zeolite-CDO composite film 415. As an illustrative example, zeolite-CDO composite film 415 may be heated in an oven while under a vacuum. Calcination process 505 may also include cooling zeolite-CDO composite film 415, after heating, to form layer 510 and freeze layer 510 into a solid form. Cooling may include allowing layer 510 to cool at room temperature for an amount of time at a variable cooling rate. Cooling may also include refrigeration within a refrigerator or other cooling device to cool layer 510.

Figure 6:
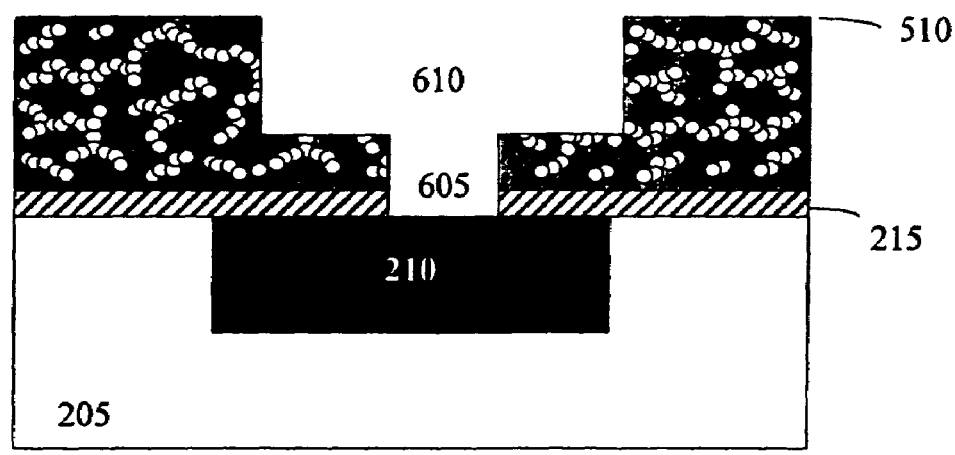
FIG. 6 is a cross-sectional elevation view of FIG. 5 after a via opening and a trench have been etched.
Figure 7:
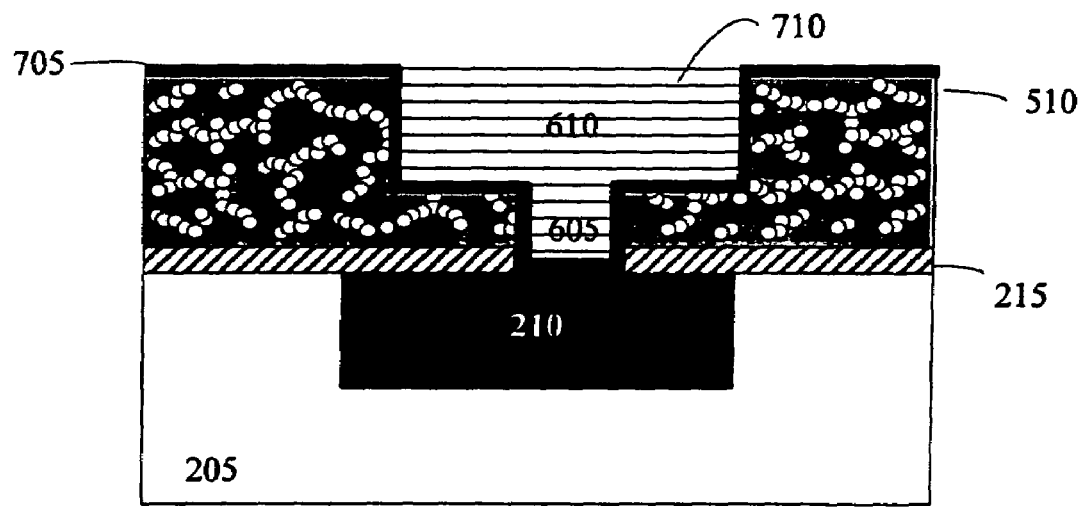
FIG. 7 is a cross-sectional elevation view of FIG. 6 after a barrier layer has been deposited on the surfaces of the zeolite-CDO film and a conductive material has been formed in the via opening and the trench.

As shown in FIG. 6 and FIG. 7, further damascene processing may be done on the zeolite-CDO composite dielectric layer 510. In FIG. 6, a via opening 605 and a trench 610 is etched in zeolite-CDO composite dielectric layer 510. In FIG. 7, a barrier layer 705 is deposited on the surfaces of zeolite-CDO composite dielectric layer 510. Then conductive material 710 is formed in via opening 605 and trench 610. It is apparent that other well-known steps, such as chemical mechanical polish (CMP) and materials, such as copper, tantalum, etc., in the damascene process have been left out so as not to obscure the discussion of zeolite-CDO composite material.

Therefore, as discussed above a composite zeolite-CDO dielectric layer/film may be created that has the low k dielectric constant and is able to form a uniform layer. The composite zeolite-CDO dielectric may have greater mechanical strength than a CDO film, because of the addition of zeolite. Furthermore, instead of the non-uniform film that is usually created with pure zeolite films, a uniform film may be created with the introduction of a CDO material into the composite.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
   depositing a zeolite-solvent solution on an underlying layer;
   removing at least some of the solvent from the zeolite-solvent solution to form a zeolite film; and
   depositing a carbon doped oxide (CDO) in the zeolite film to form a zeolite-CDO composite film;
   etching a via opening and a trench opening in CDO-zeolite composite film;
   forming a conductive material in the via opening and the trench opening.

2. The method of claim 1, wherein the solvent is water.

3. The method of claim 1, wherein the solvent is an organic oligomer.

4. The method of claim 3, wherein the organic oligomer is selected from a group consisting of polyethylene glycol, poly styrene, poly (Methacrylates), Poly (acrylate), or poly ethylene oxide.

5. The method of claim 1, wherein removing at least some of the solvent from the zeolite-solvent solution comprises:
   drying the zeolite-solvent solution.

6. The method of claim 1, wherein removing at least some of the solvent from the zeolite-solvent solution comprises:
   vacuuming the zeolite-solvent solution.

7. The method of claim 1, wherein depositing the zeolite-solvent solution on the underlying layer comprises:
   spin-coating the zeolite-solvent solution on the underlying layer.

8. The method of claim 1, wherein depositing the zeolite-solvent solution on the underlying layer comprises:
   dip-coating the zeolite-solvent solution on the underlying layer.

9. The method of claim 1, wherein depositing the CDO in the zeolite film comprises:
   chemical vapor deposition of the CDO in the zeolite film.

10. The method of claim 1, wherein the CDO is a silicon oxide.

11. The method claim 1, wherein the underlying layer is a wafer.

12. The method claim 1, wherein the underlying layer is an interlayer dielectric layer.

13. The method claim 12, wherein the interlayer dielectric layer comprises a zeolite-carbon doped oxide composite film.

14. The method of claim 1, further comprising calcinating the zeolite-CDO composite film to form a solid phase zeolite-CDO composite film.

15. The method claim 14, wherein calcinating the zeolite-CDO composite film comprises:
heating the zeolite-CDO composite film; and
cooling zeolite-CDO composite film.

16. The method of claim 15, wherein heating the zeolite-CDO composite film is done in an oven.

17. The method of claim 16, wherein the oven is at a temperature in the range of 300° C. to 550° C.

18. The method of claim 14, wherein the steps of depositing the zeolite-solvent solution, removing at least some of the solvent from the zeolite-solvent solution, and depositing a CDO are repeated before calcinating the zeolite-CDO composite film to achieve a thicker zeolite-CDO composite film.

* * * * *